US006649540B2

(12) United States Patent
Wang et al.

(10) Patent No.: US 6,649,540 B2
(45) Date of Patent: Nov. 18, 2003

(54) ORGANOSILANE CVD PRECURSORS AND THEIR USE FOR MAKING ORGANOSILANE POLYMER LOW-K DIELECTRIC FILM

(75) Inventors: Qing Min Wang, Edison, NJ (US); Ce Ma, Apex, NC (US)

(73) Assignee: The BOC Group, Inc., Murray Hill, NJ (US)

( * ) Notice: Subject to any disclaimer, the term of this patent is extended or adjusted under 35 U.S.C. 154(b) by 0 days.

(21) Appl. No.: 10/002,042

(22) Filed: Nov. 2, 2001

(65) Prior Publication Data

US 2002/0076944 A1 Jun. 20, 2002

Related U.S. Application Data

(60) Provisional application No. 60/247,396, filed on Nov. 9, 2000.

(51) Int. Cl.$^7$ ................... H01L 21/31; H01L 21/469
(52) U.S. Cl. ................... 438/789; 438/780; 438/788
(58) Field of Search ................ 438/780, 787, 438/789, 790; 427/585, 255.27

(56) References Cited

U.S. PATENT DOCUMENTS

| | | |
|---|---|---|
| 4,539,418 A | 9/1985 | Takago et al. |
| 4,599,440 A | 7/1986 | Watanabe et al. |
| 5,290,736 A | 3/1994 | Sato et al. |
| 5,412,055 A | 5/1995 | Loo |
| 5,629,439 A | 5/1997 | Bank et al. |
| 5,780,661 A | 7/1998 | Iwata et al. |
| 5,786,493 A | 7/1998 | Rauleder et al. |
| 6,068,884 A | 5/2000 | Rose et al. |
| 6,303,523 B2 * | 10/2001 | Cheung et al. ............. 438/780 |

OTHER PUBLICATIONS

Misako Imachi, Jun Nakagawa and Michiro Hayashi, "Microwave Spectrum, Structure, Dipole Moment and Internal Rotation of Allylsilane," Journal of Molecular Structure, 102 (1983) 403–412.

Michio Niwano and Nobuo Miyamoto, "UV Light–Induced Decomposition And Polymerization Of Organosilicon Compounds," Research Institute of Electrical Communication, Tohoku University, 2–1–1 Katahira, Aoba–ku, Sendai, Miyagi 980–3577, Review of Laser Engineering, vol. 26, No. 6; Jun. 1998; pp. 463–467.

Maurício F. Gozzi, M. Do Carmo Gonçalves, I. Valéria P. Yoshida, "Near–Stoichiometric Silicon Carbide From A Poly(Methylsilylene)/Tetra–Allylsilane Mixture," Journal of Materials Science 34 (1999) 155–159.

Sing–Pin Tay, J.P. Ellul, Susan B. Hewitt, N.G. Tarr, A.R. Boothroyd, "Evaluation of Silicon Carbide Formed with a Single Precursor of Di–tert–Butysilane," Materials Research Society Symposium Proceedings, vol. 242, pp. 525–530, 1992 Materials Research Society.

S. B. Hewitt, S.–P. Tay, and N. G. Tarr and A. R. Boothroyd, "Silicon Carbide Emitter Diodes by LPCVD (low–pressure chemical vapour deposition) Using di–tert–butylsilane," Can.J.Phys. vol. 70, 1992, pp. 946–948.

A.C. Dillon, M.B. Robinson, M.Y. Han and S.M. George, "Decomposition of Alkylsilanes on Silicon Surfaces Using Transmission FTIR Spectroscopy," Mat. Res. Soc.Symp. Proc. vol. 222, 1991, Materials Research Society, pp. 213–218.

R.A. Levy, J.M. Grow, Y. Yu, K.T. Shih, "Plasma Enhanced Chemical Vapor Depositon of Si–N–C–H Films from Environmentally Benign Organosilanes," Elsevier, Materials Letters 24 (1995) 47–52.

Roland A. Levy and James M. Grow, "LPCVD of Silicon Carbide Films from the Oragnosilanes Diethylsilane and Di–T–Butylsilane," Mat. Res. Soc. Symp. Proc. vol. 306, 1993 Materials Research Society, pp. 219–228.

James M. Grow, "Growth Kinetics and Properties of Silicon Carbide Films Synthesized by Low Pressure Chemical Vapor Deposition," Electrochemcial Society Proceesings, vol. 96–2, pp. 60–72.

Vladimir S. Mastryukov, Matthias Hofmann and Henry F. Schaefer III, "Structure and Conformations of Cyclopentasilane, $Si_5H_{10}$," J. Phys. Chem. A 1999, 103, pp. 5581–5584.

F. Höfler, G. Bauer and E. Hengge, "Schwingungsspektrum und Kraftkonstanten des Cyclopentasilans," Spectrochimica Acta, vol. 32A, pp. 1435–1441, Pergamon Press 1976.

(List continued on next page.)

Primary Examiner—Alexander Ghyka
(74) Attorney, Agent, or Firm—Philip H. Von Neida

(57) ABSTRACT

Methods for depositing a low-k dielectric film on the surfaces of semiconductors and integrated surfaces are disclosed. A substituted organosilane compound precursor is applied to the surface by chemical vapor deposition where it will react with the surface and form a film which will have a dielectric constant, K, less than 2.5. The substituted organosilane compounds have the general formula:

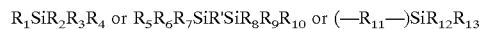

$R_1SiR_2R_3R_4$ or $R_5R_6R_7SiR'SiR_8R_9R_{10}$ or $(-R_{11}-)SiR_{12}R_{13}$ where, $R_1$ is selected from the group consisting of a cyclic or acyclic hydrocarbon having from one carbon to eight carbon atoms; $R_2$, $R_3$ and $R_4$ are the same or different, and are selected from the groups consisting of H, $CH_3$, vinyl or other hydrocarbon containing two or more carbon atoms; $R_5$, $R_6$, $R_7$, $R_8$, $R_9$, $R_{10}$ are a cyclic or acyclic hydrocarbon group including H, and can be the same or different, having from one carbon to eight carbon atoms; R' is a linking group between the two silicon atoms, and can be a cyclic or acyclic hydrocarbon group, having from one carbon to six carbon atoms; $R_{11}$ is a chelate hydrocarbon group containing two or more carbon atoms, $R_{12}$ and $R_{13}$ are a cyclic or acyclic hydrocarbon group including H, and can be the same or different.

13 Claims, No Drawings

OTHER PUBLICATIONS

Gábor Magyarfalvi, Peter Pulay, "Chemical Shift Anisotropies in Silicon Containing Three–Membered Rings. An Ab Initio Study,"Elsevier, Chemical Physics Letters 241 (1995) 393–398.

Michael C. Kwan and Karen K. Gleason, "Pyrolytic CVD of Poly(organosiloxane) Thin Films," Communications, Chemical Vapor Deposition 1997, 3, No. 6, pp. 229–301.

C.S. Pai, "High Quality Voids Free Oxide Deposition, "Elsevier, Materials Chemistry and Physics, 44 (1996) 1–8.

Takeshi Furusawa, Noriyuki Sakuma, Daisuke Ryuzaki, Seiichi Kondo, Ken–ichi Takeda, Shun–taro Machida and Kenji Hinode,"Simple, Reliable Cu/low–k Interconnect Integration Using Mechanically–strong Low–k Dielectric Materials: Silicon–oxycarbide," IEEE 2000, pp. 222–224.

Ji–Mao Lin, Ai–Min Zhou, Hui Zhang and Ai–You Hao, "Synthesis of Dialkoxydimethylsilanes and 2,2–Dimethyl–1,3–Dioxa–1–Silacyclo Compounds," Synthetic Communications, 27(14), 2527–2532 (1997).

Catrin Lorenz and Ulrich Schubert, "An Efficient Catalyst for the Conversion of Hydrosilanes to Alkoxysilanes," Chem. Ber. 1995, 128, 1267–1269.

Arun R. Srivatsa, Carlos L. Ygartua, Steve Weinzierl, Water Johnson, Torsten Kaack, "Low–k Dielectric Metrology," Solid State Technology, Aug, 2000, pp. 55–66.

Nedogrei et al., Zh. Prikl Khim, 1988, 61(4), 937–940.

* cited by examiner

ORGANOSILANE CVD PRECURSORS AND THEIR USE FOR MAKING ORGANOSILANE POLYMER LOW-K DIELECTRIC FILM

This application claims priority from Provisional Patent Application Serial No. 60/247,396 filed Nov. 9, 2000.

FIELD OF THE INVENTION

The present invention provides for methods for forming a low-k dielectric film on semiconductors or integrated circuits using a substituted organosilane compound as a low-k dielectric precursor.

BACKGROUND OF THE INVENTION

The increase in semiconductor design integration by feature size reduction has resulted in increased levels of interconnect and increased utilization of dielectric low-k thin films. The dielectric film is used as insulation around metal lines of a device and contributes to the RC time constant that controls the device speed. As the semiconductor industry has striven to reduce resistance (R) by the use of copper metallization, the push to the use of low-k dielectrics is to reduce capacitance (C). Reducing capacitance by lowering the dielectric constant k to the inter and intra level dielectric (ILD) film can improve device performance by reducing the RC time delay, decreasing the cross talk between adjacent metal lines and lowering the power dissipation.

Traditionally, the material of choice for the ILD is silicon dioxide ($SiO_2$) which can be prepared using silane, disilane or siloxane precursors in an oxidizing environment. The most popular deposition techniques for depositing ILD are chemical vapor deposition (CVD), low temperature plasma-enhanced CVD (PECVD), or high density plasma CVD (HDPCVD). However, the dielectric constant of the deposited $SiO_2$ is relatively high at 4.0.

As the semiconductor industry moves to smaller width metal lines, low-k materials must have smaller dielectric constants. Industry publications have indicated that low-k materials with k values from 2.7 to 3.5 would be needed for 150 and 130 nm technology modes. When the industry moves to 100 nm technology and dimensions below that in the future, extra low-k (ELK) materials having a k value from 2.2 to 2.6 and ultra low-k (ULK) materials with a k value less than 2.2 will be necessary.

The semiconductor industry has developed several low-k materials to replace silicon dioxide that are inorganic, organic or hybrid materials. These materials can be deposited by either chemical vapor deposition (CVD) or spin-on deposition (SOD) methods. The CVD technique utilizes existing vacuum tools for depositing $SiO_2$ that include lower temperature plasma enhanced CVD (PECVD) and high density plasma CVD (HDP-CVD). The SOD method uses spin coaters that have shown better extendibility to ELK or ULK by introducing pores in nanometer sizes. Newer materials such as fluorosilicate glass (FSG), carbon or carbon fluorine based films and carbon-doped $SiO_2$ utilize CVD techniques. Materials such as polyimide, hydrogen silsesquioxane (HSQ) and polyarylene ethers can be deposited using SOD techniques.

As such, a number of technologies to provide lower dielectric constant CVD materials have been demonstrated in the 3.5 to 2.6 range. However, there are far fewer alternatives for k values at or below 2.5 for CVD materials in ELK/ULK applications. The present invention provides for new materials for use as extra low dielectric CVD precursors in extra low-k CVD materials for the semiconductor industry.

Given the desires of the semiconductor industry for lower k value materials, new low-k CVD materials are being sought. The present invention provides a novel class of compounds useful for forming a film on a semiconductor or integrated circuit by acting as a precursor for the film formed when the compound is applied.

SUMMARY OF THE INVENTION

Substituted organosilane compounds other than methylsilane are used as precursors for forming a low-k dielectric film on the surfaces of semiconductors and integrated circuits. The resultant dielectric film formed will be an organosilicon polymer film on the surface of the device which will have low-k dielectric properties.

The substituted organosilane compounds are those having the formula $R_1SiR_2R_3R_4$ where $R_1$ is a cyclic or acyclic hydrocarbon group other than H or methyl, and $R_2$, $R_3$ and $R_4$ are the same or different and are selected from the groups consisting of H, $CH_3$, vinyl or other hydrocarbon containing two or more carbon atoms, or $R_5R_6R_7SiR'SiR_8R_9R_{10}$ where $R_5$, $R_6$, $R_7$, $R_8$, $R_9$, $R_{10}$, are a cyclic or acyclic hydrocarbon group including H, and they can be the same or different; R' is a linking group between the two silicon atoms, and it can be a cyclic or acyclic hydrocarbon group, or $(—R_{11}—)SiR_{12}R_{13}$ where $R_{11}$ is a chelate hydrocarbon group containing two or more carbon atoms, $R_{12}$ and $R_{13}$ are a cyclic or acyclic hydrocarbon group including H, and they can be the same or different. The general structures for $R_1SiR_2R_3R_4$, or $R_5R_6R_7SiR'SiR_8R_9$, $R_{10}$, or $(—R_{11}—)SiR_{12}R_{13}$ are illustrated below.

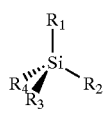

Structure I

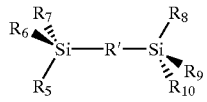

Structure II

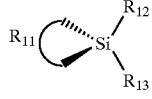

Structure III

These substituted organosilane compounds are precursors to the film formed and will react with the surface of the semiconductor or integrated circuit to form the low-k dielectric film having a dielectric constant below 2.5.

DETAILED DESCRIPTION OF THE INVENTION

The present invention relates to a method of fabricating a dielectric film on a semiconductor or integrated circuit wherein the dielectric film will be low-k comprising applying to the surface of the semiconductor or integrated circuit a substituted organosilane compound other than methylsilane.

The substituted organosilane compounds have the general formula:

$R_1SiR_2R_3R_4$ or $R_5R_6R_7SiR'SiR_8R_9R_{10}$ or $(—R_{11}—)SiR_{12}R_{13}$

Their general structures for $R_1SiR_2R_3R_4$ or $R_5R_6R_7SiR'SiR_8R_9R_{10}$ or $(—R_{11}—)SiR_{12}R_{13}$ are illustrated below.

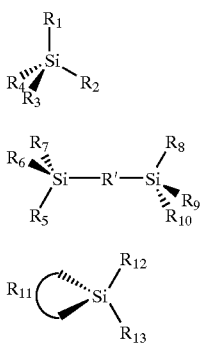

Structure I

Structure II

Structure III

In $R_1SiR_2R_3R_4$, $R_1$ is selected from the group consisting of a cyclic or acyclic hydrocarbon having from one carbon to eight carbon atoms; $R_2$, $R_3$ and $R_4$ are the same or different, and they are selected from the groups consisting of H, $CH_3$, vinyl or other hydrocarbon containing two or more carbon atoms.

In $R_5R_6R_7SiR'SiR_8R_9R_{10}$, each of $R_5$, $R_6$, $R_7$, $R_8$, $R_9$, $R_{10}$ are a cyclic or acyclic hydrocarbon group including H, and they can be the same or different, having from one carbon to eight carbon atoms; R' is a linking group between the two silicon atoms, and can be a cyclic or acyclic hydrocarbon group, having from one carbon to six carbon atoms.

In $(-R_{11}-)SiR_{12}R_{13}$, $R_{11}$ is a chelate hydrocarbon group containing two or more carbon atoms, $R_{12}$ and $R_{13}$ are a cyclic or acyclic hydrocarbon group including H, and they can be the same or different.

Representative substituted organosilane compounds having the formula $R_1SiR_2R_3R_4$ include but are not limited to n-butylmethylsilane, tert-butylmethylsilane, tert-butylphenylsilane, cyclopropylsilane, cyclobutylsilane, cyclopentylsilane, cyclohexylsilane, cyclooctylsilane, dicyclohexylsilane, diphenylsilane.

Representative substituted organosilane compounds having the formula $R_5R_6R_7SiR'SiR_8R_9R_{10}$ include but are not limited to disilylmethane and disilylbenzene.

Representative substituted organosilane compounds having the formula $(-R_{11}-)SiR_{12}R_{13}$ include but are not limited to 1-silacyclobutane, 1-silacyclopentane, and 1-silacyclohexane.

The said organosilane compounds are generally synthesized by the reduction of their chloro-substituted organosilane precursors. The reducing agents can be sodium bis (2-methoxyethoxy) aluminum hydride (65 wt. % solution in toluene), and lithium aluminum hydride ($LiAlH_4$) etc.

The films that are formed using the above-described substituted organosilane compounds will have dielectric constants, k, of below 2.5, preferably in the range 2.0 to 2.5.

The low-k dielectric films formed by the compounds of the present invention are deposited using pyrolytic or plasma-assisted CVD processes. The organosilane precursor will react with an oxygen-containing source on the surface of the wafer forming the dielectric layer.

The present invention provides for low-k precursor chemistries and process methods of depositing low-k film using CVD techniques. The process system comprises a precursor delivery manifold system, a vacuum chamber as a plasma CVD reactor, a wafer substrate, and a computer control system.

The low-k precursor of this invention is injected into vacuum chamber with or without a carrier gas. Depending upon the physical properties of a member of the low-k precursor family, either liquid or vapor phase precursor is delivered by a manifold system to the vacuum chamber. The low-k precursor material is placed in a metallic source bubbler. Both pressure and temperature of the bubbler are controlled. For high vapor pressure precursors (>5 Torr at source temperature from 25° C. to 100° C.), a direct vapor delivery method based on a pressure mass flow controller can be employed. Typically, the downstream delivery line as well as a shower head in the vacuum chamber are heat traced to avoid any condensation. The precursor can also be delivered using a liquid injection method at room temperature. The liquid phase precursor or solution of solid phase precursor can be injected to a vaporizer where it is located at the vacuum chamber. The vaporizer converts liquid phase precursor into vapor phase precursor at the point-of-use. In either case, the precursor is delivered at a rate from 1 sccm to 1000 sccm by the manifold system.

The low-k precursor family of this invention contains some necessary components for making low-k dielectric layers. These components are atoms of silicon, carbon, and hydrogen. However, an additional oxygen-containing precursor, such as $O_2$ or $N_2O$, will be required in forming low-k dielectric layers.

The vacuum chamber is a chemical vapor deposition (CVD) reactor. One viable CVD reactor in which the methods of this invention can be practiced is a parallel plate single wafer reactor. The process can be either pyrolytic or plasma-assisted CVD. The total pressure in the reactor is controlled from 0.01 mTorr to 100 Torr. RF power is applied to the upper electrode or the shower head. The RF power excites the precursor vapors that have been inputted into the vacuum chamber and generates reactive plasma. The frequency of RF is typically in the range of 1 kHz to 3 GHz. A frequency of 13.56 MHz is typical. The RF power can be varied from 1 to 1000 W. The preferred RF power is from 50 to 300 W. The RF power can be pulsed by alternating between on and off. When the duration of RF power on equals zero, the pyrolytic CVD condition is obtained.

A semiconductor substrate, typically a silicon wafer, is placed onto the bottom electrode. The size of the substrate can be up to 300 mm in diameter. The bottom electrode is heated by either electrical resistance heaters or by radiation heaters. The wafer temperature is controlled up to 600° C. The distance from the bottom electrode to the upper electrode can be also varied. Precursors deposited on the hot wafer surface will react and polymerize and this reaction and polymerization is driven by reactive species, thermal and ring strain energies. In this process, the opening and retention of the precursor ring structures of the present invention can be controlled within the low-k films.

A computer system controls the precursor delivery, RF powers, vacuum and pressure in the CVD chamber, as well as the temperature in the delivery manifold and in the reactor.

A low-k film with a thickness up to 5 microns can then be characterized for its thermal, mechanical, and electrical properties. A k value would be obtained using capacitance-voltage measurement of Metal-Insulator-Semiconductor (MIS) capacitors array. The MIS capacitors are defined by evaporated Aluminum dots on to the low-k films. The typical sizes of the Aluminum dots are in the range of 0.1 mm to 20 mm in diameter.

While this invention has been described with respect to particular embodiments thereof, it is apparent that numerous other forms and modifications of the invention will be obvious to those skilled in the art. The appended claims and this invention generally should be construed to cover all such obvious forms and modifications which are within the true spirit and scope of the present invention.

Having thus described the invention, what we claim is:

1. A method for fabricating a dielectric film having low-k values on a semiconductor or integrated circuit surface comprising applying to said surface a substituted organosilane compound precursor having the formula $R_1, R_2, R_3, R_4$ wherein $R_1$ is selected from the group consisting of a cyclic or acyclic hydrocarbon other than H, methyl, ethyl or phenyl and having from one carbon to eight carbon atoms; $R_2, R_3, R_4$ are the same or different and are selected from the group consisting of H, $CH_3$, vinyl or other hydrocarbons containing two or more carbon atoms, wherein said precursor reacts with and deposits on said surface said dielectric film.

2. The method as claimed in claim 1 wherein $R_1$ in said substituted organosilane compound is cyclic.

3. The method as claimed in claim 2 wherein said substituted organosilane compound is selected from the group consisting of cyclopropylsilane, cyclobutylsilane, cyclopentylsilane, cyclohexylsilane, cyclooctylsilane, diphenylsilane, dicyclohexylsilane.

4. The method as claimed in claim 1 wherein $R_1$ in said substituted organosilane compound is acyclic.

5. The method as claimed in claim 4 wherein said substituted organosilane compound is selected from the group consisting of n-butylmethylsilane, tert-butylmethylsilane, tert-butylphenylsilane.

6. The method as claimed in claim 1 wherein said dielectric film has a k value below 2.5.

7. The method as claimed in claim 6 wherein said dielectric film has a k value in the range of about 2.0 to about 2.5.

8. The method as claimed in claim 1 wherein said substituted organosilane compound precursor is deposited on the surface of the semiconductor or integrated circuit using chemical vapor deposition.

9. The method as claimed in claim 1 wherein said chemical vapor deposition is pyrolytic or plasma-assisted.

10. The method as claimed in claim 1 wherein said substituted organosilane compound comprises a mixture of substituted organosilane compounds.

11. The method as claimed in claim 9 wherein said precursor is in either the vapor phase or the liquid phase prior to deposition.

12. The method as claimed in claim 9 wherein said precursor is a single precursor for the source of silicon and carbon atoms.

13. The method as claimed in claim 1 further comprising applying said precursor with an additional oxidant or carrier compound.

* * * * *